(12) United States Patent
Altonen et al.

(10) Patent No.: US 7,514,933 B2
(45) Date of Patent: Apr. 7, 2009

(54) SYSTEM AND METHOD FOR DETERMINING LOCATION OF PHASE-TO-EARTH FAULT

(75) Inventors: Janne Altonen, Toijala (FI); Ari Wahlroos, Vaasa (FI)

(73) Assignee: ABB OY, Helsinki (FI)

( * ) Notice: Subject to any disclaimer, the term of this patent is extended or adjusted under 35 U.S.C. 154(b) by 0 days.

(21) Appl. No.: 11/429,956

(22) Filed: May 9, 2006

(65) Prior Publication Data

US 2006/0291113 A1 Dec. 28, 2006

(30) Foreign Application Priority Data

May 17, 2005 (FI) ................................. 20055232

(51) Int. Cl.
*G01R 31/08* (2006.01)
(52) U.S. Cl. ...................... 324/522; 324/512
(58) Field of Classification Search ................. 324/522, 324/512; 361/81
See application file for complete search history.

(56) References Cited

U.S. PATENT DOCUMENTS

| | | | |
|---|---|---|---|
| 4,313,169 A * | 1/1982 | Takagi et al. ................... | 702/59 |
| 4,996,624 A | 2/1991 | Schweitzer et al. | |
| 6,256,592 B1 | 7/2001 | Roberts et al. | |
| 6,373,670 B1 * | 4/2002 | Bo ............................... | 361/81 |
| 6,420,876 B1 * | 7/2002 | Saha et al. ................... | 324/522 |
| 6,661,630 B1 * | 12/2003 | Ahn ............................. | 361/80 |
| 2004/0032265 A1 | 2/2004 | Tuner | |
| 2004/0167729 A1 | 8/2004 | Saha et al. | |
| 2006/0125486 A1 * | 6/2006 | Premerlani et al. .......... | 324/512 |

FOREIGN PATENT DOCUMENTS

EP     1 304 580 A2     4/2003

OTHER PUBLICATIONS

Finnish Priority Application Official Action Issued Dec. 20, 2005.

* cited by examiner

*Primary Examiner*—Vincent Q Nguyen
(74) *Attorney, Agent, or Firm*—Buchanan Ingersoll & Rooney PC

(57) ABSTRACT

A method and system for determining a location of a phase-to-earth fault in a three-phase electric line of an electric network, the system being configured to monitor current and voltage quantities of the three-phase electric line at a measuring point and calculate a distance (d) between the measuring point and a point of fault (F) using an equation relating the current and voltage quantities to the distance, wherein the system is further configured to calculate load-compensated zero and negative sequence currents, calculate a load-compensated phase voltage of the faulted phase by using the compensated zero sequence current; and use the compensated negative sequence current and the compensated phase voltage for calculating the distance (d) between the measuring point and a point of fault (F).

23 Claims, 1 Drawing Sheet

SYSTEM AND METHOD FOR DETERMINING LOCATION OF PHASE-TO-EARTH FAULT

FIELD OF THE INVENTION

The present invention relates to localization of single-phase earth faults in electric networks.

BACKGROUND OF THE INVENTION

Localization of earth faults is a challenging task. There are many factors which deteriorate the accuracy of calculated fault location estimates. Distribution networks have some specific features which further complicate and challenge fault localization algorithms. These include e.g. non-homogeneity of lines, presence of laterals and load taps.

One important factor affecting the accuracy of impedance based fault localization algorithms is the combined effect of load current and fault resistance. Also phase-to-earth capacitances in high-impedance earthed systems, especially those of the protected feeder, deteriorate the accuracy of the impedance measurement.

Fault localization algorithms typically utilize either delta quantities (fault state minus healthy state) or symmetrical components to compensate for the effects of load current and fault resistance. In prior art algorithms the load compensation is typically targeted only at current quantities.

Many prior art methods are based on an assumption that load is tapped to the end point of the feeder i.e. load is always located behind the fault point. If this is the case, then the fault location estimate is accurate. Unfortunately, in real medium voltage feeders this assumption is rarely correct. In fact, due to voltage drop considerations, loads are typically located either at the beginning of the feeder or distributed more or less randomly over the entire feeder length. In such cases the accuracy of prior art fault localization algorithms is deteriorated.

Document U.S. Pat. No. 4,313,169 discloses a fault detecting system for locating a fault point. The disclosed solution is based on monitoring variations in voltage and current of a power transmission line resulting from a fault, and calculating the distance to the fault by using the variations and a line constant.

Document U.S. Pat No. 4,996,624 discloses a fault location method for radial transmission and distribution systems. In the method the positive sequence impedance is first determined and then used to determine the distance to the fault.

A problem relating to these solutions is that their application is restricted only to effectively or low-impedance earthed systems. Therefore they cannot be applied in high-impedance earthed networks.

BRIEF DESCRIPTION OF THE INVENTION

An object of the present invention is thus to provide a method and an apparatus for implementing the method so as to overcome the above problem or at least to alleviate the problem. The objects of the invention are achieved by a system, a method, and a computer-readable storage medium which are characterized by what is stated in independent claims 1, 4, 12, 15 and 21. The preferred embodiments of the invention are disclosed in the dependent claims.

The invention is based on the idea of compensating for errors generated by loading in combination with fault resistance both in voltage and current quantities when using impedance-based fault localization.

An advantage of the invention is that it provides for locating single-phase earth faults in unearthed, compensated (Petersen coil), impedance earthed, and effectively earthed networks also when the load is not exclusively tapped at the end of the line, or when the fault resistance has a high value.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

Figure 1:
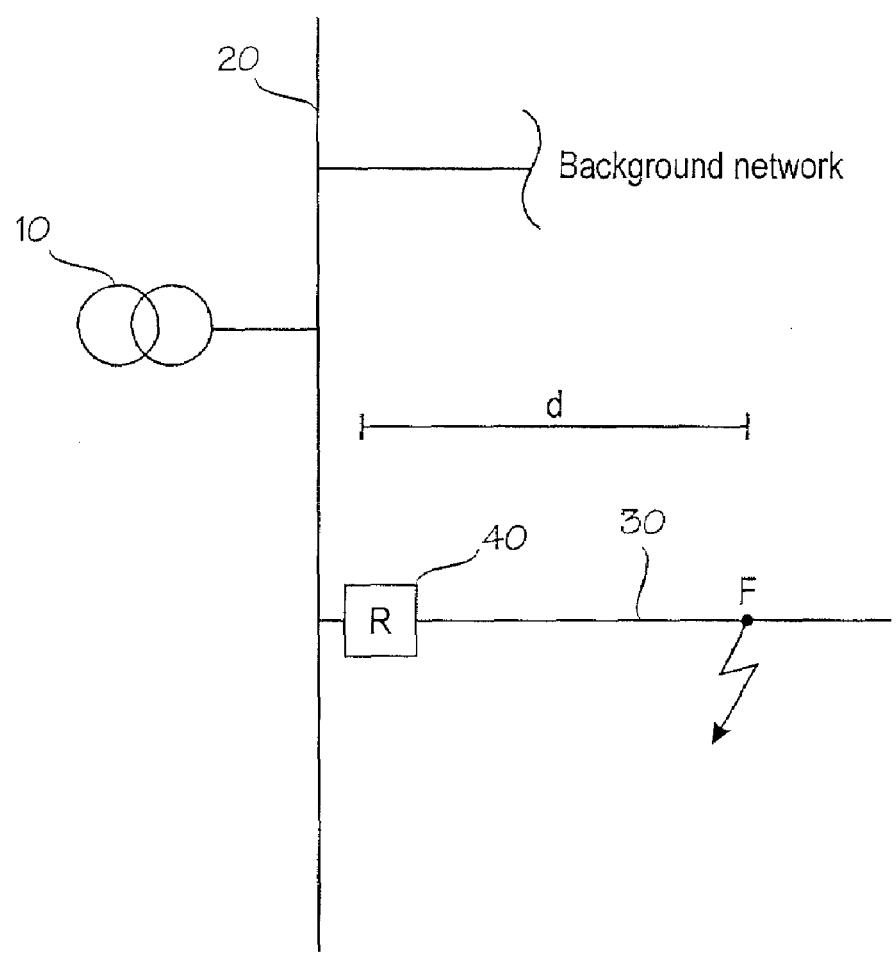
FIG. 1 is a diagram illustrating an electric network in which the invention can be used.

The use of the method and system of the invention is not limited to any specific system, but they can be used in connection with various three-phase electric systems to determine a location of a phase-to-earth fault in a three-phase electric line of an electric network. The electric line can be a feeder, for example. The electric network can be an electric transmission or distribution network or a component thereof, for example. Moreover, the use of the invention is not limited to systems employing 50-Hz or 60-Hz fundamental frequencies or to any specific voltage level.

FIG. 1 is a diagram illustrating an electric network in which the invention can be applied. The FIGURE shows only the components necessary for understanding the invention. The exemplary network can be a medium voltage (e.g. 20 kV) distribution network fed through a substation comprising a transformer 10 and a busbar 20. The network also comprises electric line outlets, i.e. feeders, of which one 30 is shown separately. Other possible feeders as well as other network parts, except the line 30, are referred to as a 'background network'. The FIGURE also shows a protective relay unit 40 at the beginning of line 30, and a point of earth fault F. It should be noted that there may be any number of feeders or other network elements in the network. There may also be several feeding substations. Further, the invention can be utilized with a switching station without a transformer 10, for example. The network is a three-phase network although, for the sake of clarity, the phases are not shown in the FIGURE. The functionality of the invention can be implemented by means of digital signal processing equipment, such as a general-purpose digital signal processor (DSP), with suitable software therein, for example. It is also possible to use a specific integrated circuit or circuits, or corresponding devices. The invention can be implemented in existing system elements, such as various protective relays, or by using separate elements or devices. In the exemplary system of FIG. 1, the functionality of the invention is preferably located in the relay unit 40. It is also possible that only some measurements are performed in unit 40 and the results are then transmitted to another unit or units in another location for further processing.

In the following, the three phases of the three-phase electricity system in which the invention is used are referred to as L1, L2, and L3. The respective phase currents of phases L1, L2, and L3 are $I_{L1}$, $I_{L2}$, and $I_{L3}$ and the phase voltages are $U_{L1}$, $U_{L2}$, and $U_{L3}$. The monitored current and voltage values are preferably obtained by a suitable measuring arrangement including e.g. current and voltage transducers (not shown in the FIGURE) connected to the phases of the electricity system. In most of the existing protection systems these values are readily available and thus the implementation of the invention does not necessarily require any separate measuring arrangements. How these values are obtained is of no relevance to the basic idea of the invention and depends on the particular electricity system to be monitored. A phase-to-earth fault F on the three-phase electric line 30 and the corresponding faulted phase of the three-phase electric line of the electricity system to be monitored may be detected by e.g. a protective relay 40 associated with the electricity system. The particular way how the phase-to-earth fault is detected and the corresponding faulted phase is identified is of no relevance to the basic idea of the invention.

Once a phase-to-earth fault is detected on an electric line (feeder) 30 and the corresponding faulted phase is identified, the determination of the location of the phase-to-earth fault proceeds preferably as follows: according to an embodiment of the invention, load-compensated zero and negative sequence currents are first calculated by using a ratio of a total zero sequence admittance of the electric network and a zero sequence admittance of the electric network without the faulted electric line 30 (i.e. a zero sequence admittance of the background network), and by using a negative sequence current of the faulted phase and a zero sequence current. Next, a load-compensated phase voltage of the faulted phase can be calculated by using the compensated zero sequence current. Finally, the compensated negative sequence current and the compensated phase voltage can be used for calculating distance d between the measuring point 40 and a point of fault F. According to another embodiment of the invention, the determination of the location of the phase-to-earth fault proceeds preferably as follows: a load-compensated negative sequence current is first calculated by using a ratio of a total zero sequence admittance of the electric network and a zero sequence admittance of the electric network without the faulted electric line 30, and by using a negative sequence current of the faulted phase and a zero sequence current. Next, a load-compensated phase voltage of the faulted phase can be calculated by using the compensated negative sequence current. Finally, the compensated negative sequence current and the compensated phase voltage can be used for calculating distance d between the measuring point 40 and a point of fault F. In the following, a more detailed description of possible embodiments of the invention is given.

According to an embodiment of the invention, first a removal of steady-state errors in sequence components ('pre' refers to a time-point before fault) is preferably performed as follows using the so-called delta quantities. It should be noted, however, that fault quantities, i.e. quantities obtained during a fault, could be used instead of the delta quantities. The use of the delta quantities is advantageous because it reduces the effect of a possible asymmetry in the network. $I_0$, $I_2$ and $U_2$ are preferably measured from the beginning of the faulted electric line 30 where the protective relay 40 can be located, whereas, $U_0$ can be measured also from another location:

$$\Delta I_0 = I_0 - I_{0pre}$$

Zero sequence current component phasor $$\Delta I_2 = I_2 - I_{2pre}$$

Negative sequence current component phasor of the faulted phase $$\Delta U_0 = U_0 - U_{0pre}$$

Zero sequence voltage component phasor $$\Delta U_2 = U_2 - U_{2pre}$$

Negative sequence voltage component phasor of the faulted phase
where (when faulted phase is L1)

$$I_0 = (I_{L1} + I_{L2} + I_{L3})/3,$$

$$I_2 = (I_{L1} + a^2 \cdot I_{L2} + a \cdot I_{L3})/3,$$

$$U_0 = (U_{L1} + U_{L2} + U_{L3})/3, \text{ and}$$

$$U_2 = (U_{L1} + a^2 \cdot U_{L2} + a \cdot U_{L3})/3, \text{ where}$$

operator $a = 1\angle 120°$ and $a^2 = 1\angle 240°$.

Next, network topology specific parameters are determined:

Source impedance can be estimated using the negative sequence quantities (when a single-phase earth fault occurs inside the protected feeder):

$$Z_{2S} = -\frac{\Delta U_2}{\Delta I_2}$$

The apparent zero sequence admittance of the background network can be determined by using the measured zero sequence quantities or network data (when a single-phase earth fault occurs inside the protected feeder):

$$\underline{Y}_{0BG} = -\frac{\Delta I_0}{\Delta \underline{U}_0} = G_{0BG} + j \cdot B_{0BG}$$

The apparent zero sequence admittance of the protected feeder can be determined by using conductor data:

$Y_{0F} = G_{0F} + j \cdot B_{0F}$, where:

$$G_{0F} = \frac{1}{R_{L0F}}, \text{ and } B_{0F} = \omega \cdot C_{0F} = \frac{1}{X_{C0F}}$$

Alternatively, the apparent zero sequence admittance of the protected feeder could be determined by measurements performed when a single-phase earth fault occurs outside the protected feeder:

$$Y_{0F} = +\frac{\Delta I_0}{\Delta \underline{U}_0}$$

The total admittance of the network is:

$Y_{0TOT} = Y_{0BG} + Y_{0F}$

A current distribution factor is:

$$K_1 = \frac{Y_{0BG} + Y_{0F}}{Y_{0BG}} = \frac{Y_{0TOT}}{Y_{0BG}}$$

where:
$Z_{2S}$=Negative sequence source impedance (assumed to be equal to positive sequence impedance),
$G_{0BG}$=Conductance representing the leakage losses of the background network,
$B_{0BG}$=Susceptance of the background network,
$G_{0F}$=Conductance representing the leakage losses of the protected feeder,
$B_{0F}$=Susceptance of the protected feeder,
$R_{L0F}$=Resistance representing the leakage losses of the protected feeder, and
$X_{C0F}$=The phase-to-earth capacitive reactance of the protected feeder The load-compensated zero and negative sequence currents are calculated by using a ratio of a total zero sequence admittance of the electric network and a zero sequence admittance of the electric network without the faulted electric line 30 (i.e. a zero sequence admittance of the background network), e.g. as indicated by the current distribution factor $K_1$, and by using the zero and negative sequence currents. This is based on the idea that the zero sequence current on the fault point F differs from the current at the beginning of the line 30 due to the earth capacitances of the line. The current on the fault point can be estimated on the basis of current distribution based on a ratio of a total zero sequence admittance of the electric network and a zero sequence admittance of the electric network without the faulted electric line 30 (i.e. a zero sequence admittance of the background network). It should be understood that impedance values could be used instead of admittance values in an equivalent manner without deviating from the basic idea of the invention. Moreover, load compensation can be done by taking into account the fact that loading affects zero and negative sequence currents differently. Accordingly, in an embodiment of the invention, compensated sequence component currents are calculated as follows:

$$I_{0Lcomp} = \Delta I_0 + I_{0Lcomp\_factor}$$

$$I_{2Lcomp} = \Delta I_2 + I_{2Lcomp\_factor},$$

where compensation factors for sequence component currents are as follows:

$$I_{0Lcomp\_factor} = (K_1 \cdot \Delta I_0 - \Delta I_2)$$

$$I_{2Lcomp\_factor} = q \cdot I_{0Lcomp\_factor},$$

$|q|$ is preferably 2.0 and $\angle q = \angle K_1 \cdot \Delta I_0 - \angle \Delta I_2$. It should be noted that other values could be used for parameter q.

According to an alternative embodiment of the invention, compensated sequence component currents are calculated as follows:

$$I_{0Lcomp2} = \left(\frac{K_1 \cdot \Delta I_0}{\Delta I_2}\right) \cdot \Delta I_0$$

$$I_{2Lcomp2} = K_1 \cdot I_{0Lcomp2} = \frac{(K_1 \Delta I_0)^2}{\Delta I_2}$$

Once the compensated zero sequence current is known, a load-compensated phase voltage can be calculated on the basis of the compensated zero sequence current. In other words, the compensated zero sequence current can be used as a reference quantity, which is used to calculate an equally compensated phase voltage. Accordingly, a compensated phase voltage $U_{Lcomp}$ can be calculated as follows:

$$U_{Lcomp\_L1} = U_{0Lcomp} + U_{1Lcomp} + U_{2Lcomp}$$

where compensated zero, positive and negative sequence voltage phasors are preferably:

$$U_{0Lcomp} = U_0 + U_{0Lcomp\_factor}$$

$$U_{1Lcomp} = U_1 + U_{1Lcomp\_factor}$$

$$U_{2Lcomp} = U_2 + U_{2Lcomp\_factor},$$

where, when $I_{0Lcomp}$ has been determined as above, compensation factors for sequence component voltages are preferably:

$$\underline{U}_{0Lcomp\_factor} = (\Delta I_0 - I_{0Lcomp}) \cdot \frac{1}{Y_{0TOT}}$$

$$\underline{U}_{1Lcomp\_factor} = (I_1 - I_{0Lcomp}) \cdot Z_{2S},$$

where the positive sequence current component phasor of the faulted phase $I_1 = (I_{L1} + a \cdot I_{L2} + a^2 \cdot I_{L3})/3$ and is preferably measured from the beginning of the faulted electric line 30, $$U_{2Lcomp\_factor} = (\Delta I_2 - I_{0Lcomp}) \cdot Z_{2S}$$

Alternatively, when $I_{2LComp2}$ has been determined as above, compensation factors for sequence component voltages are preferably:

$$\underline{U}_{0Lcomp\_factor} = (K_1 \cdot \Delta I_0 - I_{2Lcomp2}) \cdot \frac{1}{Y_{0TOT}}$$

$$\underline{U}_{1Lcomp\_factor} = (I_1 - I_{2Lcomp2}) \cdot Z_{2S}$$

$$\underline{U}_{2Lcomp\_factor} = (\Delta I_2 - I_{2Lcomp2}) \cdot Z_{2S}$$

The foregoing equations apply for all single-phase-to-earth faults. Note that the symmetrical components ($U_2, I_2, I_1$) must be phase-adjusted with factor $a = 1\angle 120°$, $a^2 = 1\angle 240°$ in case of fault types L2E (phase L2 to earth fault) and L3E (phase L3 to earth fault) according to the well-known theory of symmetrical components:

L1E: $U_{2L1} = U_2$ $I_{2L1} = I_2$ $I_{1L1} = I_1$

L2E: $U_{2L2} = a \cdot U_2$ $I_{2L2} = a \cdot I_2$ $I_{1L2} = a^2 \cdot I_1$

L3E: $U_{2L3} = a^2 \cdot U_2$ $I_{2L3} = a^2 \cdot I_2$ $I_{1L3} = a \cdot I_1$ When voltages and currents are known, fault location i.e. distance d between the measuring point 40 and fault point F can be calculated using, for example, the well-known impedance equation (eq1):

$$d = \frac{\text{Im}(\underline{U}_X) \cdot \text{Re}(I_F) - \text{Re}(\underline{U}_X) \cdot \text{Im}(I_F)}{\text{Im}(Z_1 \cdot I_X) \cdot \text{Re}(I_F) - \text{Re}(Z_1 \cdot I_X) \cdot \text{Im}(I_F) - \text{Re}(Z_N \cdot I_N) \cdot \text{Im}(I_F) + \text{Im}(Z_N \cdot I_N) \cdot \text{Re}(I_F)}$$

where
d = fault distance in per unit
$U_X$ = phase voltage phasor of phase X
$I_F$ = current phasor through fault resistance at fault location
$Z_1$ = positive sequence line impedance ($\Omega$/km) = $R_1 + j \cdot X_1$
$R_1$ = positive sequence line resistance
$X_1$ = positive sequence line reactance
$I_X$ = phase current phasor of phase X
$Z_N$ = earth return path impedance ($\Omega$/km) = $(Z_0 - Z_1)/3$
$Z_0$ = zero sequence line impedance ($\Omega$/km) = $R_0 + j \cdot X_0$
$R_0$ = zero sequence line resistance
$X_0$ = zero sequence line reactance
$I_N$ = earth return path current phasor Load current compensated current and voltage quantities are preferably utilized by applying them to eq1 as follows:
$U_X = U_{Lcomp}$
$I_F = I_X = I_N = 3*I_{2Lcomp}$ or $3*I_{2Lcomp2}$ (selection of either $I_{2Lcomp}$ or $I_{2Lcomp2}$ depends on which one of these alternatives has been determined above)

Depending on the faulted phase identified by the phase selector logic, corresponding compensated phase voltage should be used for $U_X$. Moreover, $I_X$ could be some other current component than $3*I_{2Lcomp}$ or $3*I_{2Lcomp2}$, such as a sum current or a delta quantity of the sum current, a negative sequence current or its delta quantity, or a phase current or its delta quantity. This, however, has no relevance to the basic idea of the invention.

It will be obvious to a person skilled in the art that, as technology advances, the inventive concept can be implemented in various ways. The invention and its embodiments are not limited to the examples described above but may vary within the scope of the claims.

The invention claimed is:

1. A fault detecting device for locating a phase-to-earth fault in a three-phase electric line of an electric network, the fault detecting device being configured to:
   monitor current and voltage quantities of the three-phase electric line at a measuring point;
   detect a phase-to-earth fault on the three-phase electric line and a faulted phase of the three-phase electric line;
   calculate load-compensated zero and negative sequence currents by using a ratio of a total zero sequence admittance of the electric network and a zero sequence admittance of the electric network without the faulted electric line and by using a negative sequence current of the faulted phase and a zero sequence current;
   calculate a load-compensated phase voltage of the faulted phase by using the compensated zero sequence current; and
   calculate a distance between the measuring point and a point of fault using the compensated negative sequence current and the compensated phase voltage and an equation relating the current and voltage quantities to the distance.

2. The fault detecting device of claim 1, wherein the fault detecting device is configured to calculate the compensated zero and negative sequence currents according to the following equations:

$$I_{0Lcomp} = \Delta I_0 + I_{0Lcomp\_factor},$$

$$I_{2Lcomp} = \Delta I_2 + I_{2Lcomp\_factor}, \text{ where}$$

$$\Delta I_0 = I_0 - I_{0pre},$$

where $I_0$ is a zero sequence current during the fault and $I_{0pre}$ is a pre-fault zero sequence current, $$\Delta I_2 = I_2 - I_{2pre},$$

where $I_2$ is a negative sequence current during the fault and $I_{2pre}$ is a pre-fault negative sequence current of the faulted phase, $$I_{0Lcomp\_factor} = (K_1 \cdot \Delta I_0 - \Delta I_2),$$

where $K_1$ is a current distribution factor, $$I_{2Lcomp\_factor} = q \cdot I_{0Lcomp\_factor},$$

where q is a predetermined constant.

3. The fault detecting device of claim 2, wherein the fault detecting device is configured to calculate the compensated phase voltage according to the following equation:

$$U_{Lcomp} = U_{0Lcomp} + U_{1Lcomp} + U_{2Lcomp}, \text{ where}$$

$$U_{0Lcomp} = U_0 + U_{0Lcomp\_factor}$$

$$U_{1Lcomp} = U_1 + U_{1Lcomp\_factor}$$

$$U_{2Lcomp} = U_2 + U_{2Lcomp\_factor}, \text{ where}$$

$U_0$=zero sequence voltage,
$U_1$=positive sequence voltage,
$U_2$=negative sequence voltage, $$U_{0Lcomp\_factor} = (\Delta I_0 - I_{0Lcomp}) \cdot \frac{1}{Y_{0TOT}},$$

where $Y_{0TOT}$ is the zero sequence admittance of the electric network, $$U_{1Lcomp\_factor} = (I_1 - I_{0Lcomp}) \cdot Z_{2S},$$

where $Z_{2S}$ is the negative sequence source impedance and $I_1$ is the positive sequence current, and $$U_{2Lcomp\_factor} = (\Delta I_2 - I_{0Lcomp}) \cdot Z_{2S}.$$

4. The fault detecting device of claim 3, wherein the fault detecting device is configured to:
   calculate the negative sequence source impedance and a zero sequence admittance of a background network using values of the monitored current and voltage quantities;
   calculate a zero sequence admittance of the electric line using predetermined line parameters;
   calculate the zero sequence admittance of the electric network and a current distribution factor using the zero sequence admittance of the background network and the zero sequence admittance of the electric line.

5. The fault detecting device of claim 4, wherein the fault detecting device is configured to calculate the negative sequence source impedance $Z_{2S}$ and the zero sequence admittance $Y_{0BG}$ of the background network according to the following formulas:

$$\underline{Z}_{2S} = -\frac{\Delta U_2}{\Delta I_2},$$

$$\underline{Y}_{0BG} = -\frac{\Delta I_0}{\Delta U_0} = G_{0BG} + j \cdot B_{0BG}, \text{ where}$$

$$\Delta U_0 = U_0 - U_{0pre},$$

where $U_0$ is a zero sequence voltage during the fault and $U_{0pre}$ is a pre-fault zero sequence voltage, and $$\Delta U_2 = U_2 - U_{2pre},$$

where $U_2$ is a negative sequence voltage during the fault and $U_{2pre}$ is a pre-fault negative sequence voltage of the faulted phase.

6. The fault detecting device of claim 5, wherein the fault detecting device is configured to calculate the zero sequence admittance of the electric line $Y_{0F}$ according to the following formula:

$$Y_{0F} = G_{0F} + j \cdot B_{0F}, \text{ where:}$$

$B_{0F}$=zero sequence susceptance of the electric line
$G_{0F}$=leakage conductance of the electric line.

7. The fault detecting device of claim 6, wherein the fault detecting device is configured to calculate the zero sequence admittance of the electric network $Y_{0TOT}$ and the current distribution factor $K_1$ according to the following formulas:

$$\underline{Y}_{0TOT} = \underline{Y}_{0BG} + \underline{Y}_{0F},$$

$$\underline{K}_1 = \frac{Y_{0BG} + Y_{0F}}{Y_{0BG}} = \frac{Y_{0TOT}}{Y_{0BG}}.$$

8. The fault detecting device of claim 2, wherein $|q|$ is 2.0 and $\angle q = \angle K_1 \cdot \Delta I_0 - \angle \Delta I_2$.

9. A fault detecting device for locating a phase-to-earth fault in a three-phase electric line of an electric network, the fault detecting device being configured to:
   monitor current and voltage quantities of the three-phase electric line at a measuring point;

detect a phase-to-earth fault on the three-phase electric line and a faulted phase of the three-phase electric line;

calculate a load-compensated negative sequence current by using a ratio of a total zero sequence admittance of the electric network and a zero sequence admittance of the electric network without the faulted electric line and by using a negative sequence current of the faulted phase and a zero sequence current;

calculate a load-compensated phase voltage of the faulted phase by using the compensated negative sequence current; and calculate a distance between the measuring point and a point of fault using the compensated negative sequence current and the compensated phase voltage and an equation relating the current and voltage quantities to the distance.

10. The fault detecting device of claim 9, wherein the fault detecting device is configured to calculate the compensated negative sequence current according to the following equation:

$$I_{2Lcomp2} = \frac{(K_1 \cdot \Delta I_0)^2}{\Delta I_2} \text{ where}$$

$\Delta I_0 = I_0 - I_{0pre}$, where $I_0$ is a zero sequence current during the fault and $I_{0pre}$ is a pre-fault zero sequence current, $\Delta I_2 = I_2 - I_{2pre}$, where $I_2$ is a negative sequence current during the fault and $I_{2pre}$ is a pre-fault negative sequence current of the faulted phase, and $K_1$ = current distribution factor.

11. The fault detecting device of claim 10, wherein the fault detecting device is configured to calculate the compensated phase voltage according to the following equations:

$U_{Lcomp} = U_{0Lcomp} + U_{1Lcomp} + U_{2Lcomp}$, where $U_{0Lcomp} = U_0 + U_{0Lcomp\_factor}$ $U_{1Lcomp} = U_1 + U_{1Lcomp\_factor}$ $U_{2Lcomp} = U_2 + U_{2Lcomp\_factor}$, where $U_0$ = zero sequence voltage,
$U_1$ = positive sequence voltage,
$U_2$ = negative sequence voltage, $$\underline{U}_{0Lcomp\_factor} = (K_1 \cdot \Delta I_0 - I_{2Lcomp2}) \cdot \frac{1}{\underline{Y}_{0TOT}}$$

where $Y_{0TOT}$ is the zero sequence admittance of the electric network, $U_{1Lcomp\_factor} = (I_1 - I_{2Lcomp2}) \cdot Z_{2S}$, where $Z_{2S}$ is the negative sequence source impedance and $I_1$ is the positive sequence current, and $U_{2Lcomp\_factor} = (\Delta I_2 - I_{2Lcomp2}) \cdot Z_{2S}$.

12. A method for determining a location of a phase-to-earth fault in a three-phase electric line of an electric network, the method comprising:

monitoring current and voltage quantities of the three-phase electric line at a measuring point;

detecting a phase-to-earth fault on the three-phase electric line and a faulted phase of the three-phase electric line;

calculating load-compensated zero and negative sequence currents by using a total zero sequence admittance of the electric network and a zero sequence admittance of the electric network without the faulted electric line and by using a negative sequence current of the faulted phase and a zero sequence current;

calculating a load-compensated phase voltage of the faulted phase by using the compensated zero sequence current; and calculating a distance between the measuring point and a point of fault using the compensated negative sequence current and the compensated phase voltage and an equation relating the current and voltage quantities to the distance.

13. The method of claim 12, wherein the compensated zero and negative sequence currents are calculated according to the following equations:

$I_{0Lcomp} = \Delta I_0 + I_{0Lcomp\_factor}$, $I_{2Lcomp} = \Delta I_2 + I_{2Lcomp\_factor}$, where $\Delta I_0 = I_0 - I_{0pre}$, where $I_0$ is a zero sequence current during the fault and $I_{0pre}$ is a pre-fault zero sequence current, $\Delta I_2 = I_2 - I_{2pre}$, where $I_2$ is a negative sequence current during the fault and $I_{2pre}$ is a pre-fault negative sequence current of the faulted phase, $I_{0Lcomp\_factor} = (K_1 \cdot \Delta I_0 - \Delta I_2)$, where $K_1$ is a current distribution factor, $I_{2Lcomp\_factor} = q \cdot I_{0Lcomp\_factor}$, where q is a predetermined constant.

14. The method of claim 13, wherein the compensated phase voltage is calculated according to the following equation:

$U_{Lcomp} = U_{0Lcomp} + U_{1Lcomp} + U_{2Lcomp}$, where $U_{0Lcomp} = U_0 + U_{0Lcomp\_factor}$ $U_{1Lcomp} = U_1 + U_{1Lcomp\_factor}$ $U_{2Lcomp} = U_2 + U_{2Lcomp\_factor}$, where $U_0$ = zero sequence voltage,
$U_1$ = positive sequence voltage,
$U_2$ = negative sequence voltage, $$\underline{U}_{0Lcomp\_factor} = (\Delta I_0 - I_{0Lcomp}) \cdot \frac{1}{\underline{Y}_{0TOT}},$$

where $Y_{0TOT}$ is the zero sequence admittance of the electric network, $U_{1Lcomp\_factor} = (I_1 - I_{0Lcomp}) \cdot Z_{2S}$, where $Z_{2S}$ is the negative sequence source impedance and $I_1$ is the positive sequence current, and $U_{2Lcomp\_factor} = (\Delta I_2 - I_{0Lcomp}) \cdot Z_{2S}$.

15. The method of claim 14, wherein the method comprises:

calculating the negative sequence source impedance and a zero sequence admittance of a background network using values of the monitored current and voltage quantities;

calculating a zero sequence admittance of the electric line using predetermined line parameters;

calculating the zero sequence admittance of the electric network and a current distribution factor using the zero sequence admittance of the background network and the zero sequence admittance of the electric line.

16. The method of claim 15, wherein the negative sequence source impedance $Z_{2S}$ and the zero sequence admittance $Y_{0BG}$ of the background network according are calculated according to the following formulas:

$$Z_{2S} = -\frac{\Delta U_2}{\Delta I_2},$$

$$Y_{0BG} = -\frac{\Delta I_0}{\Delta U_0} = G_{0BG} + j \cdot B_{0BG}, \text{ where}$$

$\Delta U_0 = U_0 - U_{0pre}$, where $U_0$ is a zero sequence voltage during the fault and $U_{0pre}$ is a pre-fault zero sequence voltage, and $\Delta U_2 = U_2 - U_{2pre}$, where $U_2$ is a negative sequence voltage during the fault and $U_{2pre}$ is a pre-fault negative sequence voltage of the faulted phase.

17. The method of claim 16, wherein the zero sequence admittance of the electric line $Y_{0F}$ is calculated according to the following formula:

$Y_{0F} = G_{0F} + j \cdot B_{0F}$, where:

$B_{0F}$ = zero sequence susceptance of the electric line
$G_{0F}$ = leakage conductance of the electric line.

18. The method of claim 17, wherein the zero sequence admittance of the electric network $Y_{0TOT}$ and the current distribution factor $K_1$ are calculated according to the following formulas:

$$Y_{0TOT} = Y_{0BG} + Y_{0F},$$

$$K_1 = \frac{Y_{0BG} + Y_{0F}}{Y_{0BG}} = \frac{Y_{0TOT}}{Y_{0BG}}.$$

19. The method of claim 13, wherein |q| is 2.0 and $<q=<K_1 \cdot \Delta I_0 - <\Delta I_2$.

20. A computer-readable storage medium comprising a computer software, wherein the execution of the software in a computer causes the computer to carry out the steps of the method according to claim 12.

21. A method for determining a location of a phase-to-earth fault in a three-phase electric line of an electric network, the method comprising:

monitoring current and voltage quantities of the three-phase electric line at a measuring point;

detecting a phase-to-earth fault on the three-phase electric line and a faulted phase of the three-phase electric line;

calculating a load-compensated negative sequence current by using a ratio of a total zero sequence admittance of the electric network and a zero sequence admittance of the electric network without the faulted electric line and by using a negative sequence current of the faulted phase and a zero sequence current;

calculating a load-compensated phase voltage of the faulted phase by using the compensated negative sequence current; and calculating a distance between the measuring point and a point of fault using the compensated negative sequence current and the compensated phase voltage and an equation relating the current and voltage quantities to the distance.

22. The method of claim 21, wherein the compensated negative sequence current is calculated according to the following equation:

$$I_{2Lcomp2} = \frac{(K_1 \cdot \Delta I_0)^2}{\Delta I_2} \text{ where}$$

$\Delta I_0 = I_0 - I_{0pre}$, where $I_0$ is a zero sequence current during the fault and $I_{0pre}$ is a pre-fault zero sequence current, $\Delta I_2 = I_2 - I_{2pre}$, where $I_2$ is a negative sequence current during the fault and $I_{2pre}$ is a pre-fault negative sequence current of the faulted phase, and $K_1$ = current distribution factor.

23. The method of claim 22, wherein the compensated phase voltage is calculated according to the following equation:

$U_{Lcomp} = U_{0Lcomp} + U_{1Lcomp} + U_{2Lcomp}$, where $U_{0Lcomp} = U_0 + U_{0Lcomp\_factor}$ $U_{1Lcomp} = U_1 + U_{1Lcomp\_factor}$ $U_{2Lcomp} = U_2 + U_{2Lcomp\_factor}$, where $U_0$ = zero sequence voltage,
$U_1$ = positive sequence voltage,
$U_2$ = negative sequence voltage, $$U_{0Lcomp\_factor} = (K_1 \cdot \Delta I_0 - I_{2Lcomp2}) \cdot \frac{1}{Y_{0TOT}}$$

where $Y_{0TOT}$ is the zero sequence admittance of the electric network, $U_{1Lcomp\_factor} = (I_1 - I_{2Lcomp2}) \cdot Z_{2S}$, where $Z_{2S}$ is the negative sequence source impedance and $I_1$ is the positive sequence current, and $U_{2Lcomp\_factor} = (\Delta I_2 - I_{2Lcomp2}) \cdot Z_{2S}$.

* * * * *